(12) United States Patent
D'Andrade et al.

(10) Patent No.: US 8,513,658 B2
(45) Date of Patent: Aug. 20, 2013

(54) WHITE PHOSPHORESCENT ORGANIC LIGHT EMITTING DEVICES

(75) Inventors: Brian D'Andrade, Westhampton, NJ (US); James Esler, Yardley, PA (US); Vadim Adamovich, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 284 days.

(21) Appl. No.: 13/062,162

(22) PCT Filed: Sep. 4, 2009

(86) PCT No.: PCT/US2009/056066
§ 371 (c)(1),
(2), (4) Date: May 20, 2011

(87) PCT Pub. No.: WO2010/028262
PCT Pub. Date: Mar. 11, 2010

(65) Prior Publication Data
US 2011/0215309 A1      Sep. 8, 2011

Related U.S. Application Data

(60) Provisional application No. 61/094,145, filed on Sep. 4, 2008.

(51) Int. Cl.
*H01L 35/24* (2006.01)
(52) U.S. Cl.
USPC .................................... 257/40; 257/E51.001
(58) Field of Classification Search
USPC ........................................... 257/40, E51.001
See application file for complete search history.

(56) References Cited

U.S. PATENT DOCUMENTS

| 4,769,292 A | 9/1988 | Tang et al. |
| 5,061,569 A | 10/1991 | VanSlyke et al. |
| 5,247,190 A | 9/1993 | Friend et al. |
| 5,703,436 A | 12/1997 | Forrest et al. |

(Continued)

FOREIGN PATENT DOCUMENTS

| EP | 0650955 | 5/1995 |
| EP | 1589789 | 10/2005 |

(Continued)

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(methylphenylphenyl-amino)triphenylamine (m-MTDATA), as Hole-Transport Materials," *Adv. Mater.*, 6(9):677-679 (1994).

(Continued)

*Primary Examiner* — Anthony Ho
(74) *Attorney, Agent, or Firm* — Sterne, Kessler, Goldstein & Fox PLLC

(57) ABSTRACT

A device is provided. The device includes an anode, a cathode and a double emissive layer disposed between the anode and the cathode. The double emissive layer includes a first organic emissive layer and a second organic emissive layer. The second organic emissive layer is disposed between the anode and the cathode, and is adjacent to the first organic emissive layer. The device also includes a blocking layer disposed adjacent to the second organic emissive layer and between the second organic emissive layer and the anode. The device also includes a hole transport layer disposed between the blocking layer and the anode. At least one of the anode and the cathode is transmissive.

15 Claims, 4 Drawing Sheets

(56) References Cited

U.S. PATENT DOCUMENTS

| | | |
|---|---|---|
| 5,707,745 A | 1/1998 | Forrest et al. |
| 5,834,893 A | 11/1998 | Bulovic et al. |
| 5,884,363 A | 3/1999 | Tofts |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,687,266 B1 | 2/2004 | Ma et al. |
| 6,835,469 B2 | 12/2004 | Kwong et al. |
| 6,869,695 B2 | 3/2005 | Thompson et al. |
| 7,009,338 B2 | 3/2006 | D'Andrade et al. |
| 7,022,421 B2 | 4/2006 | Thompson et al. |
| 7,078,113 B2 | 7/2006 | Thompson et al. |
| 7,087,321 B2 | 8/2006 | Kwong et al. |
| 7,151,339 B2 | 12/2006 | Adamovich et al. |
| 7,279,704 B2 | 10/2007 | Walters et al. |
| 7,285,907 B2 | 10/2007 | D'Andrade et al. |
| 7,294,849 B2 | 11/2007 | Thompson et al. |
| 7,431,968 B1 | 10/2008 | Shtein et al. |
| 7,466,073 B2 | 12/2008 | Kishino et al. |
| 7,714,498 B2 | 5/2010 | Aoyama et al. |
| 7,768,195 B2 | 8/2010 | Jinde et al. |
| 7,862,906 B2 | 1/2011 | Abe |
| 7,871,711 B2 | 1/2011 | Itai |
| 2002/0034656 A1 | 3/2002 | Thompson et al. |
| 2002/0134984 A1 | 9/2002 | Igarashi |
| 2003/0175553 A1 | 9/2003 | Thompson et al. |
| 2003/0230980 A1 | 12/2003 | Forrest et al. |
| 2004/0174116 A1 | 9/2004 | Lu et al. |
| 2005/0025993 A1 | 2/2005 | Thompson et al. |
| 2005/0046337 A1 | 3/2005 | Chin et al. |
| 2005/0074630 A1 | 4/2005 | Kanno |
| 2005/0077817 A1 | 4/2005 | Yamazaki et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0046098 A1 | 3/2006 | Hosokawa |
| 2006/0141288 A1 | 6/2006 | Matsuura et al. |
| 2006/0202194 A1 | 9/2006 | Jeong et al. |
| 2006/0232194 A1 | 10/2006 | Tung et al. |
| 2006/0251923 A1 | 11/2006 | Lin et al. |
| 2006/0280965 A1 | 12/2006 | Kwong et al. |
| 2007/0190359 A1 | 8/2007 | Knowles et al. |

FOREIGN PATENT DOCUMENTS

| | | |
|---|---|---|
| EP | 1670082 | 6/2008 |
| JP | 2003229272 | 8/2003 |
| JP | 200511610 | 1/2005 |
| JP | 2005038672 | 2/2005 |
| JP | 2007123392 | 5/2007 |
| JP | 2007254297 | 10/2007 |
| WO | WO 0139234 | 5/2001 |
| WO | WO 0202714 | 1/2002 |
| WO | WO 03040257 | 5/2003 |
| WO | WO 03060958 | 7/2003 |
| WO | WO 2004093207 | 10/2004 |
| WO | WO 2004107822 | 12/2004 |
| WO | WO 2005014551 | 2/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006082742 | 8/2006 |
| WO | WO 2006098120 | 9/2006 |
| WO | WO 2006103874 | 10/2006 |
| WO | WO 2006114966 | 11/2006 |
| WO | WO 2006132173 | 12/2006 |
| WO | WO 2007004380 | 1/2007 |
| WO | WO 2007063754 | 6/2007 |
| WO | WO 2007063796 | 6/2007 |
| WO | 2009/030981 | 3/2009 |
| WO | 2010/028262 | 3/2010 |

OTHER PUBLICATIONS

Paulose, Betty Marie Jennifer S. et al., "First Examples of Alkeny Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral $Ru^{II}$ PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. and VanSlyke, S.A., "Organic Electroluminescent Diodes," *Appl. Phys. Lett.*, 51(12):913-915 (1987).

Adachi, Chihaya et al., "Organic Electroluminescent Device Having a Hole Conductor as Emitting Layer," *Appl. Phys. Lett.*, 55(15):1489-1491 (1989).

Ma, Yuguang et al., "Triplet Luminescent Dinuclear-Gold(*I*) Complex-Based Light-Emitting Diodes with Low Turn-On voltage," *Appl. Phys. Lett.*, 74(10):1361-1363 (1999).

Gao, Zhiqiang et al., "Bright-Blue Electroluminescence from a Silyl-Substituted ter-(phenylene-vinylene) derivative," *Appl. Phys. Lett.*, 74(6):865-867 (1999).

Lee, Chang-Lyoul et al., "Polymer Phosphorescent Light-Emitting Devices with Tris-(2-phenylpyridine) Iridium as a Triplet Emitter," *Appl. Phys. Lett.*, 77(15):2280-2282 (2000).

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic Light-Emitting Diodes with Phosphorescent Platinum Complexes Containing NCN-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006)

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Hamada, Yuji et al., "High Luminance in Organic Electroluminescent Devices with Bis(10-hydroxybenzol[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly-Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazol[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota, Yasuhiko, "5,5'Bis(dimesitylboryl)-2,2'-bithiophene and 5,5"-Bis(dimesitylboryl)-2,2':5',2"-terthiophene as a Novel Family of Electron-Transporting Amorphous Molecular Materials," *J. Am. Chem. Soc.*, 120 (37):9714-9715 (1998).

Sakamoto, Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15):2160-2162 (1996).

Guo, Tzung-Fang et al, "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergård et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-*b*]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

Search Report corresponding to the PCT/US2009/056066 application.

Tanaka et al.: "High Luminous Efficiency Blue Organic Light-Emitting Devices Using high Triplet Excited Energy Materials" Japanese Journal of Applied Physics, Japan Society of Applied Physics, Tokyo,JP, vol. 46, No. 4-7, Feb. 1, 2007, pp. L117- L119.

Kyung Soo Son et al.: "Blue organic electrophosphorescence diodes using diarylamino-substituted heterocyclic compounds as host material" Journal of Photopolymer Science and Technology, vol. 20, No. 1, 2007, pp. 47-51.

Adamovich V I et al., "Improving the performance of PHOLEDs by using dual doping" Proc. of SPIE, vol. 7051, Aug. 26, 2008, pp. 70510D-1-70510D-8.

Holmes R et al.: "Saturated deep blue organic electrophosphorescence using a fluorine-free emitter" Applied Physics Letters, AIP, American Institute of Physics, Melville, NY, US, vol. 87, No. 24, Dec. 7, 2005, pp. 243507-243507.

Park Y R et al.: "Organic light-emitting devices with In-doped (4 at. %) ZnO thin films as the anodic electrode" Japanese Journal of Applied Physics, Japan Society of Applied Physics, Tokyo, JP, vol. 47, No. 1, Jan. 1, 2008, pp. 468-471.

Baldo et al., "Highly Efficient Phosphorescent Emission from Organic Electroluminescent Devices," Nature, vol. 395, 151-154, 1998; ("Baldo-I").

Baldo et al., "Very high-efficiency green organic light-emitting devices based on electrophosphorescence," Appl. Phys. Lett., vol. 75, No. 3, 4-6 (1999) ("Baldo-II").

Dodabalapur et al, "Physics and applications of organic microcavity light emitting diodes," J. Appl. Phys. 80 (12), Dec. 15, 1996.

So et al., "Bipolar Carrier Transport in Organic Small Molecules for OLED," Proceedings of the Society for Information Display. 38, 1497 (2007).

B. W. D'Andrade, J.-Y. Tsai, C. Lin, M. S. Weaver, P. B. Mackenzie, and J. J. Brown, Efficient white phosphorescent organic light-Emitting devices, Long Beach, CA, United States, 2007 (Society for Information Display, San Jose, CA 95112-4006, United States), p. 1026-1029.

B. D'Andrade, M. S. Weaver, and J. J. Brown, White phosphorescent organic light emitting devices, SPIE 6655, 6332-6334 (2007).

B. W. D'Andrade, R. J. Holmes, and S. R. Forrest, Efficient organic electrophosphorescent whitelight-emitting device with a triple doped emissive layer, Advanced Materials 16, 624-628 (2004).

B. W. D'Andrade and S. R. Forrest, White organic light-emitting devices for solid-state lighting, Advanced Materials 16, 1585-1595 (2004).

B. W. D'Andrade, 1. Brooks, V. Adamovich, M. E. Thompson, and S. R. Forrest, White light emission using triplet excimers in electrophosphorescent organic light-emitting devices, Advanced Materials 14, 1032-1036 (2002).

Adamovich, J. Brooks, A. Tamayo, A. M. Alexander, P. I. Djurovich, B. W. D'Andrade, C. Adachi, S. R. Forrest, and M. E. Thompson, High efficiency single dopant white electrophosphorescent light emitting diodes, New Journal of Chemistry 26, 1171-1178 (2002).

International Search Report and Written Opinion corresponding to the PCT/IB2007/004687 application mailed May 7, 2009.

Baldo et al., "High-efficiency fluorescent organic light-emitting devices using a phosphorescent sensitizer", Nature, Nature Publishing Group, London, UK, vol. 403, Feb. 17, 2000, pp. 750-753.

E. E. Namdas, T.D.Anthopoulos, I.D.W.Samuel, Applied Physics Letters 86, 161104 (2005).

Vadim Adamovich, Novel materials and techniques of fabrication for organic light emitting diodes. PhD, Thesis. Published Nov. 25, 2003.

T.D.Anthopoulos, M.J.Frampton, E.B.Namdas, P.L.Burn, I.D.W. Samuel, Adv. Mater.2004, 16, No. 6, Mar. 18, pp. 557-560.

U.S. Appl. No. 61/094,145, filed Sep. 4, 2008.

U.S. Appl. No. 60/763,189, filed Jan. 27, 2006.

U.S. Appl. No. 61/065,131, filed Feb. 9, 2008.

Gary L. Miessler and Donald A. Tarr "Inorganic Chemistry" (2nd Edition) Pentice-Hall, pp. 1-3; 422-424 (1998).

International Search Report in the corresponding PCT application No. PCT/US2009/030545.

WHITE PHOSPHORESCENT ORGANIC LIGHT EMITTING DEVICES

CROSS-REFERENCES TO RELATED APPLICATIONS

This application claims priority to and benefit under 35 U.S.C. §119(e) to International Application No. PCT/US2009/056066 filed Sep. 4, 2009 and U.S. Provisional Application Ser. No. 61/094,145, filed Sep. 4, 2008, the disclosure of which is herein expressly incorporated by reference in its entirety.

STATEMENT AS TO RIGHTS TO INVENTIONS MADE UNDER FEDERALLY SPONSORED RESEARCH OR DEVELOPMENT

This invention was made with support under Federal Contract Grant Nos. DE-FG02-06ER84582 and DE-FG02-05ER84263. The government has certain rights in the.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

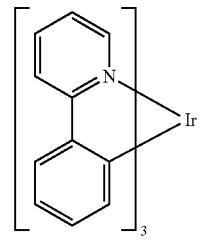

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

A device is provided. The device includes an anode, a cathode and a double emissive layer disposed between the anode and the cathode. The double emissive layer includes a first organic emissive layer and a second organic emissive layer. The first organic emissive layer includes a first phosphorescent material having a concentration of 15-35 wt % in the first organic emissive layer, and a peak emissive wavelength in the visible spectrum at a wavelength between 400 nm and 500 nm; and a first host material having a triplet energy at least 0.2 eV and not more than 1.0 eV greater than the triplet energy of the first phosphorescent material. The second organic emissive layer includes a second phosphorescent material having a concentration of 15-35 wt % in the second organic emissive layer, and a peak emissive wavelength in the visible spectrum at a wavelength between 500 nm and 600 nm, and a third phosphorescent material having a concentration of 0.1-3 wt % in the second organic emissive layer, and a peak emissive wavelength in the visible spectrum at a wavelength between 600 nm and 700 nm. The second host material has a triplet energy greater than that of the third phosphorescent emissive material. The second organic emissive layer is disposed between the anode and the cathode, and is adjacent to the first organic emissive layer. The device also includes a blocking layer disposed adjacent to the second organic emissive layer and between the second organic emissive layer and the anode. The blocking layer has a lowest unoccupied molecular orbital that is at least 0.1 eV greater than the lowest unoccupied molecular orbital of the second host material. The device also includes a hole transport layer disposed between the blocking layer and the anode. At least one of the anode and the cathode is transmissive.

The device may have a transmissive anode and a reflective cathode. In such a device, the second organic emissive layer may be disposed closer to the anode than the first organic emissive layer.

The device may have a reflective anode and a transmissive cathode. In such a device, the second organic emissive layer may be disposed closer to the cathode than the first organic emissive layer.

Indium zinc oxide is a preferred anode material. Other materials may be used, such as indium tin oxide. The hole transport layer preferably has a hole mobility of at least $5 \times 10^{-4}$ cm2 V-1 s-1. NPD is a preferred material for the hole transport layer. Compound B is a preferred material for the second phosphorescent material.

The first host material may have a triplet energy at least 0.2 eV and not more than 0.5 eV greater than the triplet energy of the first phosphorescent material.

The device may have a low voltage drop. For example, the voltage drop across the device may be 3.5 eV-4.1 eV. The voltage drop across the device may be less than 3.7 eV. These voltage drops may be at a luminance of 1000 cd/m$^2$.

It is preferred that the first organic emissive layer have a thickness of 4 nm to 6 nm, that the blocking layer have a thickness of 12-18 nm, and that the and the hole transport layer have a thickness of 12-18 nm. Other preferred ranges are that the first organic emissive layer have a thickness of 4 nm to 10 nm, that the blocking layer have a thickness of 12-37 nm, and that the and the hole transport layer have a thickness of 12-37 nm.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
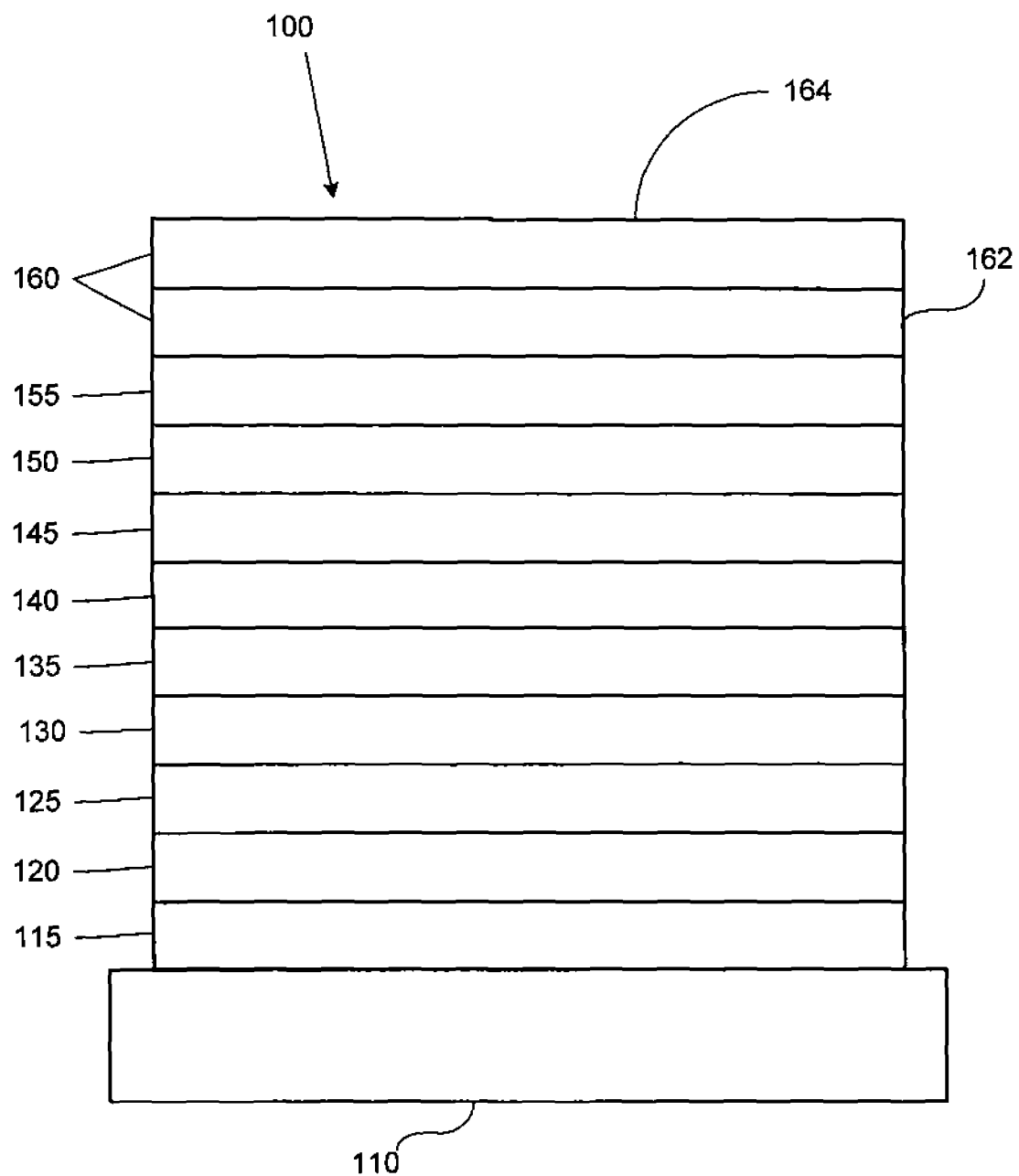
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
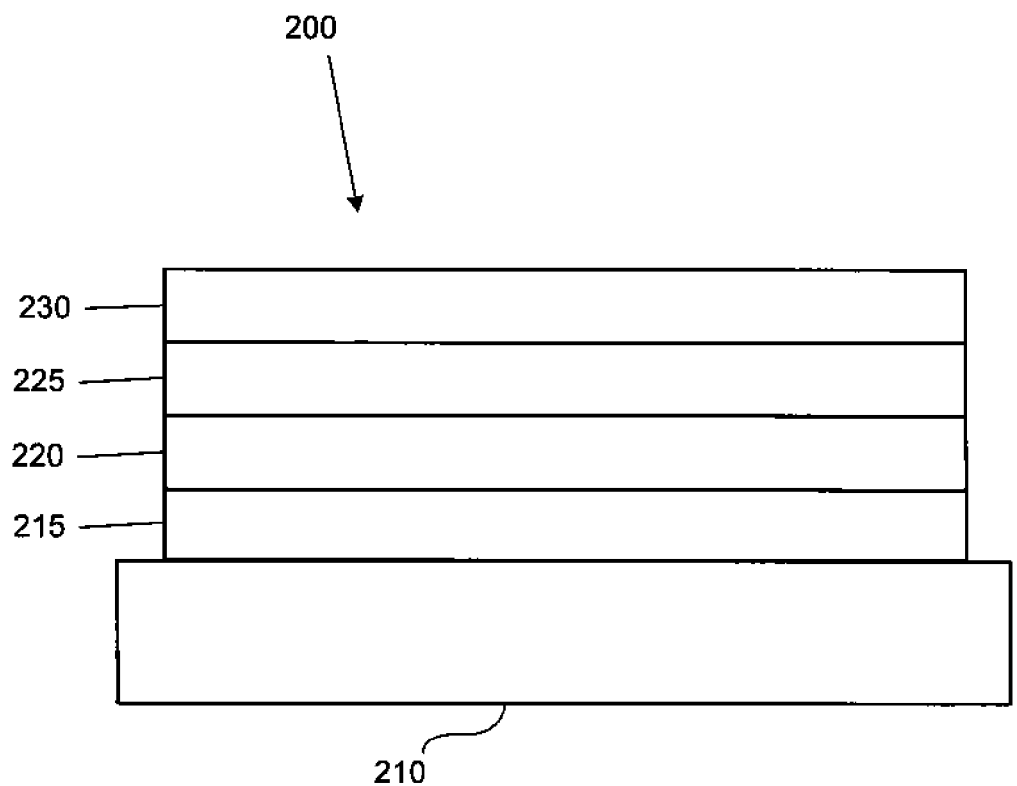
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures.

More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

One challenge facing white organic light emitting device (WOLED) technology is obtaining near 100% internal quantum efficiency simultaneously with obtaining low voltage operation. Device architectures are provided that use high concentrations of phosphorescent materials to accomplish three enhanced WOLED performance characteristics: high power efficacy with low voltage and high external efficiency, color stability and device operational stability. Emitter molecules are believed to carry charge so device operating voltage is reduced by increasing the concentration of the yellow and blue emitters. Unexpectedly, the high emitter concentration still enables high external quantum efficiency. Typically, device efficiency decreases with high emitter concentrations because of concentration quenching effects. However, the WOLEDs disclosed here have low voltage and high external quantum efficiency simultaneously, so device power efficacy can exceed 100 lm/W when outcoupling enhancement fixtures are attached to the WOLED substrate and indium-zinc-oxide is used as the anode. The color difference between the initial and aged device is important for consumers and small shifts are mandated for energy star solid-state products. These WOLEDs have demonstrated u'v' shift of <0.02 when aged to 50% of their initial luminance, and the small CIE shift is ascribed to the emitters trapping efficiency which increases with emitter concentration. Finally, the LT50>8,000 hrs from an initial luminance of 1,000 cd/m$^2$ is obtained for the same device with high efficiency, and this is a breakthrough because stable devices are not typically the most efficient devices.

A device architecture is provided that achieves a desirable combination of power efficacy and lifetime in a white emitting device. Such a device may be suitable for general illumination purposes. For example, Device 1 of Table 1 has a measured device efficiency that is >100 lm/W at an effective Lambertian luminance of 1,000 nits when outcoupling fixtures are attached to the OLED substrate. Additionally, the LT50>8,000 hrs from 1,000 nits, measured without outcoupling fixtures. The combination of these features is highly desirable for illumination products, and is unexpectedly greater than any performance previously reported.

Factors that contribute to the high efficacy of the device architecture described herein include the use of a double emissive layer, having separate emissive layers for the blue emitter and the higher wavelength emitter, the high (>15%) concentrations for certain phosphorescent materials, the use of hole transport and hole blocking layers, and consideration of optical cavity effects.

The double emissive layer is preferred because the voltage drop across a blue host, such as compound F of Table 1, is greater than the voltage drop across a host for higher wavelength emitters, such as compound K of Table 1, for the same thicknesses host materials. This is because the high energy of blue emission may put constraints on the selection of host material that are not present for lower energy (higher wavelength) emission. This is shown, for example, by the operating voltage difference between Device 1 and Device 6 of Tables 1 and 2. A 5 nm thin blue EML and a 10 nm thick yellow+red EML is therefore an efficient method to ensure that the total voltage across the emissive layers as a whole remains as low as possible, while still achieving a combination of emission spectra suitable for a high CRI and white CIE coordinates.

Generally, as used herein, "blue," "yellow," and "red" emission are used as proxies for "high," "medium," and "low" energy emission, respectively, even if the specific color may be intermediate to these specific colors, i.e., green, orange, or the like. "Blue" is used herein to refer to emission having a peak wavelength in the visible spectrum of 400 nm-500 nm, "yellow" refers to a peak wavelength in the visible spectrum of 500 nm-600 nm, and "red" refers to a peak wavelength in the visible spectrum of 600 nm-700 nm.

Additionally, energy transfer from the blue emitter to the yellow and red emitter may occur in a double emissive layer structure. This transfer depends upon dopant concentrations, and may be controlled by adjusting dopant concentration. In general, it is easier to control dopant concentrations at relatively high concentrations, such as 15 wt % and up, than it is at lower concentrations, such as 3 wt % and lower. For example, in Table 1, in devices 1-5, only one emitter is doped at <=1.0% to provide the various emission spectra used to obtain 'white' emission. This is in contrast to Device 6, where two emitters are doped at <1.0%.

A double emissive layer may also be used to compel emission at the interface of the emissive layers, which may reduce color shifts with luminance and aging. Recombination tends to happen at interfaces due to differences in energy levels, conductivity of layers and morphological disparities.

In the device architectures described, device operating voltage is inversely related to the blue and yellow emitter concentrations. High concentrations enable low operating voltage and low emitter concentrations promote high operating voltages. The blue and yellow emitters transport charge in this device structure. Generally, phosphorescent emitters are used to transport holes.

The red emitter concentration is low to ensure that it's photoluminescence quantum yield (PLQY) is near 100%. High concentrations of an emitter in a host may reduce the emitter's PLQY. The high EQE for warm white colors, that contain significant (>60% emission above 550 nm) red emission, is therefore more readily obtained when the red emitter has the highest PLQY.

The hole transport (NPD in Table 1) and blocking (compound A in table 1) layer thicknesses are selected to reduce charge and exciton leakage from the emissive layer while keeping the device operating voltage to a minimum. For example, Compound A is a more efficient blocking material than NPD. Compound A has a reduction energy of −2.89 V as opposed to −2.8V for NPD, showing that Compound A may have a LUMO energy similar to that of NPD. NPD has an oxidation energy of 0.38 V as compared to 0.43 V for Compound A, showing that NPD has a higher HOMO energy than Compound A. The difference between the reduction and oxidation potentials for these materials indicates that Compound A has a larger band gap than NPD. Thus, the combination of NPD and Compound A shown in Table 1 will act as a better electron blocker than NPD alone, and may also slow holes slightly at the NPD/Compound A interface due to the HOMO level difference, providing the ability to tune charge balance in the device.

The white device optical cavity may be selected to increase or maximize the output of all photons. The optical cavity has specific layer thicknesses, emitter concentrations, charge balance and recombination location. A relatively thin device with one reflective electrode may have only one antinode per wavelength, and that antinode will be closer to the reflective electrode for lower wavelengths. In this situation, the highest outcoupling efficiency is obtained when the distance between the emitter and the reflective electrode increases as the emitter emission wavelength increases. Thus, in a device having a reflective electrode and a transmissive electrode, and where a blue emitter is the lowest wavelength emitter, it is advantageous to locate the blue emitter closest to the reflective electrode. However, for thicker devices, there may be multiple antinodes per wavelength, and there may be antinodes for various wavelengths at different positions such that good outcoupling efficiency may be obtained by locating emitters at antinodes for the wavelength of light emitted, and the different emitters may be in any order.

Figure 3:
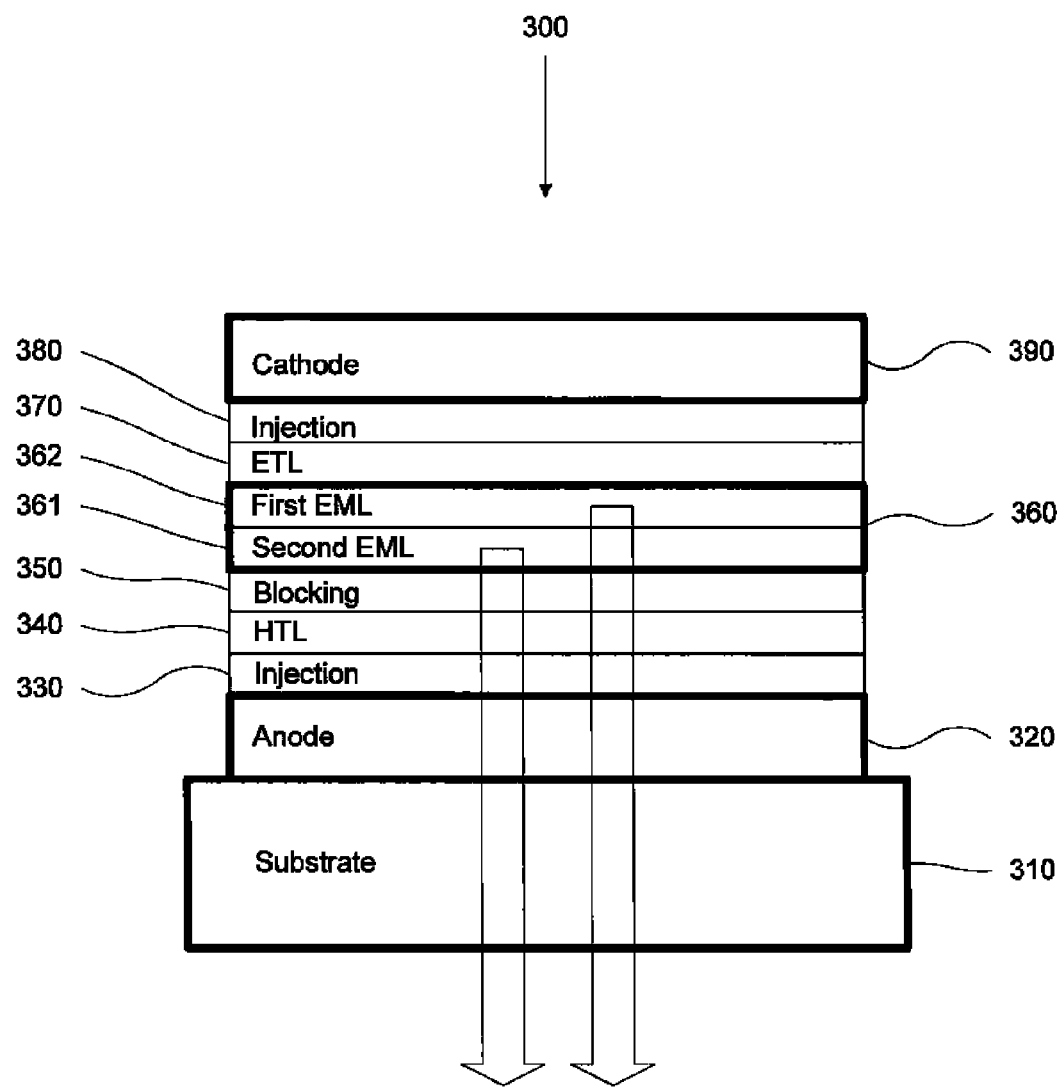
FIG. 3 shows a device with a double emissive layer that emits through the anode.

FIG. 3 shows an organic light emitting device 300. Device 300 is disposed on a substrate 310, and includes a transmissive anode 320 and a cathode 390. A double organic emissive layer 360 is disposed between anode 320 and cathode 390. Double organic emissive layer 360 further comprises a first organic emissive layer 362, and a second organic emissive layer 361. Second organic emissive layer 361 is disposed adjacent to first organic emissive layer 362, and closer to anode 320 than first organic emissive layer 362. Device 300 also includes a hole injection layer 330, a hole transport layer 340 and a blocking layer 350 disposed, in that order, between anode 320 and double organic emissive layer 360. Device 300 also includes an electron transport layer 370 and an electron injection layer 380 disposed, in that order, between double emissive layer 360 and cathode 390.

In one embodiment, an organic light emitting device that emits white light includes at least a transmissive anode, a cathode, a double organic emissive layer, a blocking layer, and a hole injection layer as illustrated in FIG. 3. It is preferred, but optional, to include other layers.

Preferred materials for a transmissive electrode, such as a transmissive anode, include transparent conductive oxides. Indium tin oxide is a preferred and commonly used material. Indium zinc oxide is a particularly preferred material.

Preferably, first organic emissive layer 362 includes a first phosphorescent material having a concentration of 15-35 wt % in the first organic emissive layer, with a peak emissive wavelength in the visible spectrum at a wavelength between 400 nm and 500 nm, and a first host material having a triplet energy at least 0.2 eV and not more than 1.0 eV greater than the triplet energy of the first phosphorescent material. A lower triplet energy for the first host may result in unwanted transfers of triplet from the first phosphorescent material to the first host material. A higher triplet energy for the host may result in a layer having undesirably low conductivity. The concentration of first phosphorescent emissive material is relatively high compared to many devices. However, in this particular device architecture, the high concentration of first phosphorescent emissive material contributes favorably to device performance by affecting charge transport mechanisms in the device. The high dopant concentration allows for hole transport within the layer, which may spread the recombination zone. The high concentration of phosphorescent dopant also ensures that the availability of dopant molecules does not become a bottleneck to emission efficiency. At concentrations higher than 35%, concentration quenching may become an issue. At concentrations less than 15%, in this particular architecture, holes may be undesirably inhibited from transport in layer 362.

Notably, the blue emitting (peak wavelength between 400 and 500 nm) phosphorescent material of the device is in its own layer, separated from the other phosphorescent materials in the device. The lower peak wavelengths of blue emitting materials correspond to a higher triplet energy. There are various issues that arise when using higher triplet energy emissive materials that do not arise to the same extent with lower triplet energy materials. For example, as described, the selection of hosts is limited to materials having a triplet energy higher than that of the emissive material. Such materials contribute to voltage drop across the device. In addition, the combination of blue-emitting phosphorescent material and suitable host may have a resistivity that is high relative to what can be achieved when there are less constraints on material selection. For example, layers that include only red and green emissive materials may use host materials with a lower triplet energy, such that lower resistivities may be readily obtained. Due to the resistivity issue, it is preferred to use a first organic emissive layer having a low thickness, 4 nm to 6 nm. A thickness of 4 nm to 10 nm is also preferred for the same reason. Lower thicknesses may not be thick enough to emit the desired blue light. Higher thicknesses may contribute unnecessarily to the overall electrical resistance of the device.

Preferably, second organic emissive layer 361 includes a second phosphorescent material having a concentration of 15-35 wt % in the second organic emissive layer, with a peak emissive wavelength in the visible spectrum at a wavelength between 500 nm and 600 nm, and a third phosphorescent material having a concentration of 0.1-3 wt % in the second organic emissive layer, with a peak emissive wavelength in the visible spectrum at a wavelength between 600 nm and 700 nm. The second organic emissive layer also includes a second host material having a triplet energy greater than that of the third phosphorescent emissive material.

While the second host material has a triplet energy greater than that of the third phosphorescent material, it is optional that the second host material have a triplet energy greater than that of the second phosphorescent material. In order for a phosphorescent material to contribute meaningfully to the emission spectra of a device, it should have a triplet energy lower than the host material of the layer in which it is present. Thus, in the described architecture, the third phosphorescent material should emit light, but the second phosphorescent material does not necessarily emit light. The second phosphorescent material contribute to device performance in other ways. At the concentrations described, the second phosphorescent material may act as an excellent hole transport material in the second organic emissive layer, and may also sensitize emission of the third phosphorescent material. If significant emission from the second phosphorescent material is desired, the second host material should have a triplet energy greater than that of the second phosphorescent material.

The second phosphorescent material preferably has a concentration of 15-35 wt % in the second organic emissive layer. This concentration allows the second phosphorescent material to transport holes across the second organic emissive layer to the first organic emissive layer with a high hole conductivity. At lower concentrations, such transport may not occur, or may occur, but with lower hole conductivity. At higher concentrations, charge balance may be affected and decrease device efficiency, i.e., a higher concentration may increase the hole transporting ability of the layer to the point that holes leak out of the emissive layer. Compound B is a preferred example of a material that may be used as the second phosphorescent material. Other materials that may be used include materials listed in Table 3 below that have the required peak emissive wavelength.

Without being limited to any theory as to why the invention works, it is believed that one reason for the exceptional power efficacy, including devices with over 100 lm/watt, is the use of a double organic emissive layer 360 with high hole conductivity in both layers. High hole conductivity in first organic emissive layer 362 is achieved by using a concentration of 15-35 wt % for the first phosphorescent material. The high hole conductivity allows holes to readily move away from the interface between first organic emissive layer 362 and second organic emissive layer 361, spreading the recombination zone and reducing issues associated with a dense recombination zone, particularly near an interface. High hole conductivity in second organic emissive layer 361 is achieved by using a concentration of 15-35 wt % for the second phosphorescent material. Hole conduction in second organic emissive layer 361, which is on the anode side of double emissive layer 360, allows holes from the anode to reach a recombination zone near the interface between first organic emissive layer 362 and second organic emissive layer 361. Hole conduction in host-dopant combinations used in the emissive layers of a phosphorescent organic light emitting device generally occurs on the dopant molecule. At the concentrations described, it is expected that superior hole conduction will be the result for a wide range of phosphorescent dopants and hosts for such dopants. Table 3 below provides many examples of such hosts and dopants. It may also be possible to achieve high hole conductivity and correspondingly superior results without using such a high dopant concentration, by selecting particular combinations of host and dopant that have high hole conductivity at dopant concentrations lower than 15 wt %.

The third phosphorescent material having a concentration of 0.1-3 wt % in the second organic emissive layer. The third phosphorescent material is present primarily to emit red light and contribute to desirable CIE and CRI for the device. At lower concentration, there may not be sufficient emission of red light. Because the emission of the third phosphorescent material is sensitized by the presence of the second phosphorescent material, there may be too much emission of red light and/or concentration quenching at concentrations higher than 3 wt %. Compound C is a preferred example of a material that may be used as the third phosphorescent material. Other materials that may be used include materials listed in Table 3 below that have the required peak emissive wavelength.

The cathode is preferably reflective, and the second emissive layer is preferably disposed closer to the transmissive anode than to the cathode. This arrangement allows for several favorable effects. First, it is desirable to locate an emissive material at an optical "node" corresponding to the desired emissive wavelength for the material. As a first-order approximation, when there is one reflective layer, there is a node at an optical path distance of one quarter of the emissive wavelength from the reflective layer. Thus, it is desirable to place a blue emissive material closer to the reflective layer than the higher wavelength emissive materials. The transmissive anode may also have some reflectivity, which may vary with wavelength. As a result, the first order approximation may not be entirely accurate in determining exactly where to place a layer, although it may still be generally desirable to place the blue-emitting layer will closer to the cathode than the higher wavelength emitting layers. Modeling that can be used to determine exactly where to place a layer in a device to achieve optical cavity optimization is known. Such modeling is described in Dodabalapur et al, *Physics and applications of organic microcavity light emitting diodes*, J. Appl. Phys. 80 (12), 15 Dec. 1996. A program that may be used for such modeling is available from Flumim AG. Dorfstrasse 7, 8835 Fueseberg, Switzerland. IZO is preferred for use as a transmissive anode in part because it has a higher index of refraction than ITO, which is a commonly used transmissive electrode material. Adjusting the location of an emissive material should be achieved by adjusting the thickness of highly conductive layers, such as the hole transport and electron transport layers, in order to minimize any increase in voltage drop across the device, and to minimize the impact of the additional thickness on charge balance considerations that may affect where recombination occurs.

The blocking layer is disposed adjacent to the second organic emissive layer and between the second organic emissive layer and the anode. The blocking layer has a lowest unoccupied molecular orbital that is at least 0.1 eV greater than the lowest unoccupied molecular orbital of the second host material. As a result of this difference, electrons are less likely to pass from the second organic emissive layer to the blocking layer.

A hole transport layer is disposed between the blocking layer and the anode. Preferably, a material with a high hole conductivity is used for the hole transport layer. NPD is a preferred material, but other material may be used. NPD has a hole mobility of $5 \times 10^{-4}$ cm$^2$ V$^{-1}$ s$^{-1}$, see, So et al., 'Bipolar Carrier Transport in Organic Small Molecules for OLED,' Proceedings of the Society for Information Display. 38, 1497 (2007). Materials having a hole mobility comparable to or higher than that of NPD may be used. Suitable materials are listed in Table 3 below.

In the architecture described for FIG. 3, it is preferred that the blocking layer 350 has a thickness of 12-18 nm and the hole transport layer 340 has a thickness of 12-18 nm. Other preferred thicknesses are that the blocking layer 350 has a thickness of 12-37 nm and the hole transport layer 340 has a thickness of 12-37 nm. These thicknesses are large enough to allow each layer to perform its intended function, but not so thick as to contribute unnecessarily to voltage drop across the device. In addition, for an architecture that includes only the layers illustrated in FIG. 3, and because injection layers are generally very thin, the total thickness of hole transport layer 340 and blocking layer 350 is responsible for most of the distance between anode 320 and double emissive layer 360. The range of thicknesses described is useful for taking advantage of optical cavity effects.

When a layer is described as "transmissive," it is meant that, when the device is in use, light passes through the layer to a viewer. Any transmittance sufficient to achieve this function is sufficient. The transmittance of a layer is generally wavelength dependent, and a 50% average transmittance across the spectrum of visible light is at the lower end of useable transmittances for a transmissive electrode. Generally, much higher transmittance layers are available and would be preferred for a "transmissive" layer as defined herein.

By using the architecture and selecting the materials as described above, a white emitting device having an exceptionally low voltage drop across the device may be achieved. The voltage drop across the device is preferably 3.5 eV-4.1 eV. More preferably, the voltage drop across the device is less than 3.7 eV. These voltage drops may be at a luminance of 1000 cd/m$^2$. It is desirable to minimize voltage drop across the device. Voltage drop is due to several factors. First, the blue emitting material of the device has a triplet energy of about 2.7 eV, which, as the highest triplet energy emissive material in the device, sets a minimum for the voltage drop across the device. Then, each layer and each interface in the device may contribute to an additional voltage drop, either due to the resistance of the layer, or due to HOMO/LUMO differences at an interface. By using the architecture and selecting the materials as described above, voltage drop may be minimized.

In the architecture of FIG. 3, recombination preferably occurs within double organic emissive layer 360. Because recombination often occurs at or near an interface, it is preferred that recombination occur at or near the interface of first organic emissive layer 362, and second organic emissive layer 361. In this case, electrons are primarily responsible for conduction between the cathode and the interface of first organic emissive layer 362, and second organic emissive layer 361, and holes are primarily responsible for conduction between the anode and said interface. This is one reason why second organic emissive layer 362 is heavily doped with the second phosphorescent material, which may not even emit in the device—phosphorescent materials are generally good hole transporters, and the second phosphorescent material may cause second organic emissive layer 361 to have good hole conduction.

Figure 4:
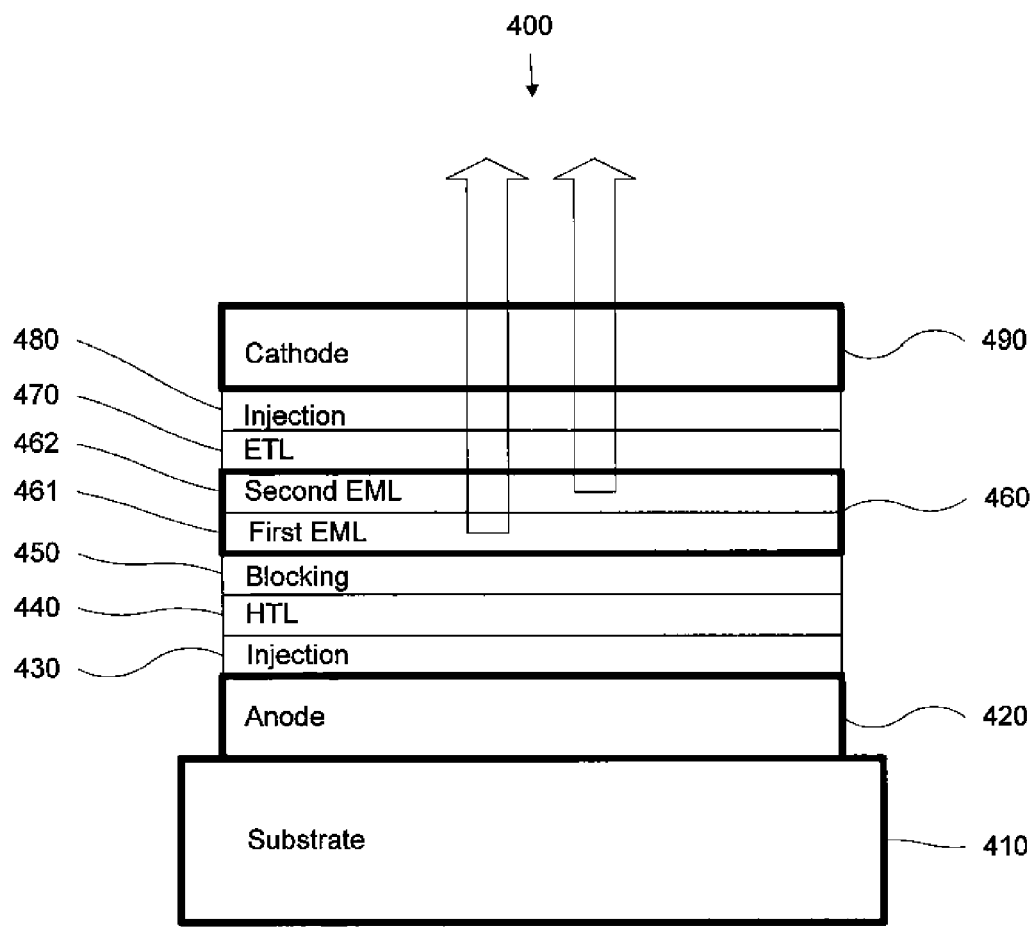
FIG. 4 shows a device with a double emissive layer that emits through the cathode.

Using different material selections, the principals behind the architecture of FIG. 3 may be adapted to a device having a transmissive cathode. FIG. 4 shows such as device.

Similar to device 300 of FIG. 3, device 400 of FIG. 4 is disposed on a substrate 410, and includes an anode 420 and a cathode 490. One difference between devices 300 and 400 is that device 400 is required to have a transmissive cathode 490. A double organic emissive layer 460 is disposed between anode 420 and cathode 490. Double organic emissive layer 460 further comprises a first organic emissive layer 461, and a second organic emissive layer 462. First organic emissive layer 461 is disposed adjacent to second organic emissive layer 462. One difference between device 300 and device 400 is that, in device 400, first organic emissive layer 461 is disposed closer to anode 420 than second organic emissive layer 462. Device 400 also includes a hole injection layer 430, a hole transport layer 440 and a blocking layer 450 disposed, in that order, between anode 420 and double organic emissive layer 460. Device 400 also includes an electron transport layer 470 and an electron injection layer 480 disposed, in that order, between double emissive layer 460 and cathode 490.

The difference between first and second organic emissive layers 362 and 361 of device 300, and first and second emissive layers 461 and 462 of device 400, is not merely semantic, because of the way the properties and characteristics of the materials in these layers are defined. In simple terms, device 300 has the blue-emitting layer (first organic emissive layer 362) disposed closer to the cathode than the other emissive layer, while device 400 has the blue-emitting layer (first organic emissive layer 461) disposed closer to the anode.

Preferably, first organic emissive layer 461 includes a first phosphorescent material having a concentration of 15-35 wt % in the first organic emissive layer, with a peak emissive wavelength in the visible spectrum at a wavelength between 400 nm and 500 nm, and a first host material having a triplet energy at least 0.2 eV and not more than 1.0 eV greater than the triplet energy of the first phosphorescent material. A lower triplet energy for the first host may result in unwanted transfers of triplet from the first phosphorescent material to the first host material. A higher triplet energy for the host may result in a layer having undesirably low conductivity. The concentration of first phosphorescent emissive material is relatively high compared to many devices. Charge transport mechanisms similar to those discussed for layer 361 are also applicable to layer 461.

Notably, the blue emitting (peak wavelength between 400 and 500 nm) phosphorescent material of device 400 is in its own layer, first organic emissive layer 461, separated from the other phosphorescent materials in the device. The considerations are similar to those described with respect to device 300—due to constraints on material selection in the blue-emitting layer, trade-offs need to be made and it is preferred to use a first organic emissive layer 361 or 461 having a low thickness, 4 nm to 6 nm. A thickness of 4 nm to 10 nm is also preferred for the same reasons.

Preferably, second organic emissive layer 462 includes a second phosphorescent material having a concentration of 15-35 wt % in the second organic emissive layer, with a peak emissive wavelength in the visible spectrum at a wavelength between 500 nm and 600 nm, and a third phosphorescent material having a concentration of 0.1-3 wt % in the second organic emissive layer, with a peak emissive wavelength in the visible spectrum at a wavelength between 600 nm and 700 nm. Second organic emissive layer 462 also includes a second host material having a triplet energy greater than that of the third phosphorescent emissive material.

The discussion of the relative triplet energies, which materials emit, and sensitized emission of the materials in second organic emissive layer 361 also apply to second organic emissive layer 462.

The second phosphorescent material preferably has a concentration of 15-35 wt % in the second organic emissive layer. It is preferred that the host carry electrons due to the potential instability of emitters to electrons. Thus, the electron conductivities of the hosts may be a factor in determining where recombination occurs. It is preferred that the host having the better electron conducting properties be located closer to the cathode. An example of such a device is where a blue emissive material, such as Compound H, is doped in mCBP, and a red emissive material, such as Compound C, is doped in BAlq. BAlq is a better electron transporter than mCBP, favoring placement of the red emissive layer closer to the cathode, as shown in Device 9.

The third phosphorescent material having a concentration of 0.1-3 wt % in second organic emissive layer 462. The third phosphorescent material is present primarily to emit red light and contribute to desirable CIE and CRI for the device. At lower concentration, there may not be sufficient emission of red light. Because the emission of the third phosphorescent material is sensitized by the presence of the second phosphorescent material, there may be too much emission of red light and/or concentration quenching at concentrations higher than 3 wt %. Compound C is a preferred example of a material that may be used as the third phosphorescent material. Other materials that may be used include materials listed in Table 3 below that have the required peak emissive wavelength.

Preferably, anode 420 is reflective. Similar considerations regarding optical cavities apply to devices 300 and 400, such as the preference for locating the lower wavelength emitter closer to the reflective electrode, and locating emissive materials at nodes for the wavelength of emission desired from the material.

In both devices 300 and 400, the devices are illustrated as grown anode-first on a substrate, but they may be grown cathode-first on the substrate.

Compounds are labeled for use herein as follows:

Compound A

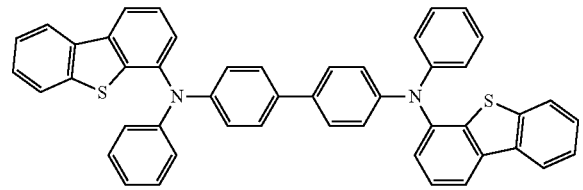

-continued

Compound B

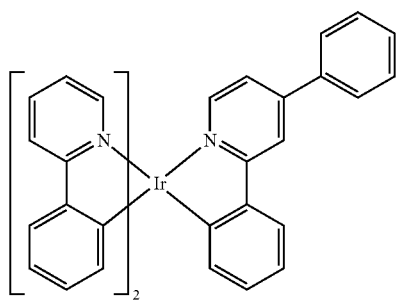

Compound C

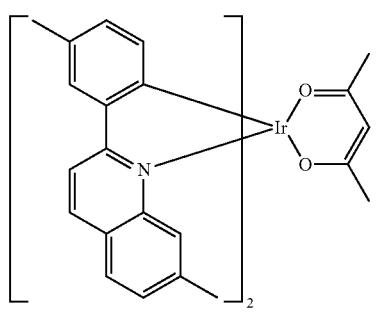

Compound D

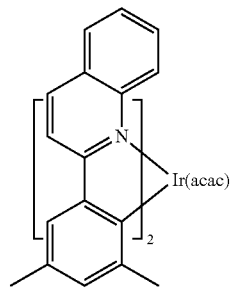

Compound E

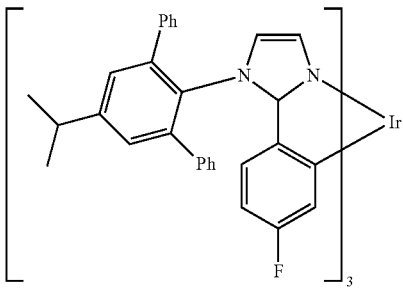

Compound F

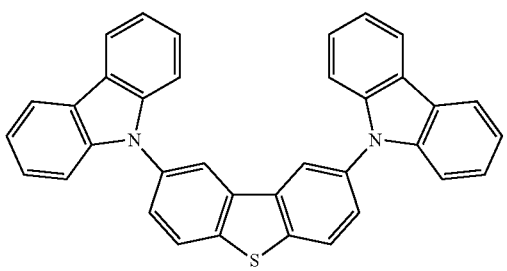

-continued

Compound G

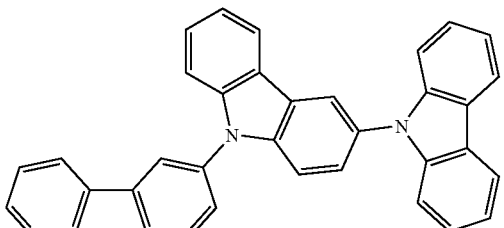

Compound H

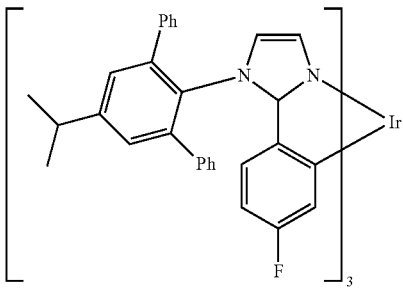

Compound I

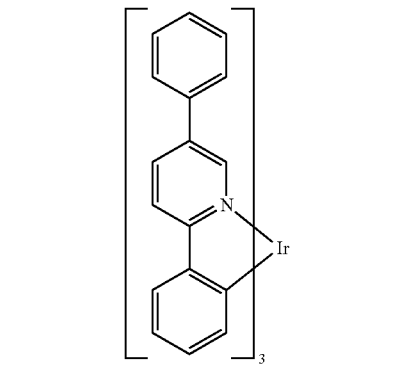

Compound J

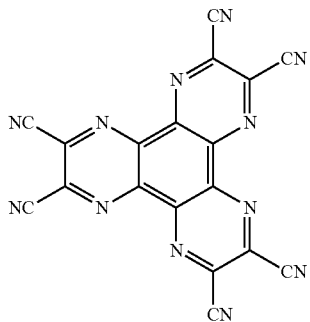

Compound M is TCTA, or 4,4',4"-tris-(N-carbazolyl)-triphenlyamine. TPBI is 1,3,5-tris-(N-phenylbenzimidazole-2-yl)-benzene.

Compound K is a compound available as NS60 from Nippon Steel Company (NSCC) of Tokyo, Japan. Compound L is available as LG201, from LG Chemicals of Korea.

EXPERIMENTAL

Devices were fabricated using standard fabrication techniques. The devices had the structure shown in Table 1. Percentages are wt %. The performance of the devices was measured, and the measured performance is shown in Table 2. The device characteristics in Table 2 were determined by simultaneously measuring the current and voltage (V) and luminance normal to the substrate, so the external quantum efficiency (EQE) and power efficacy (PE) were calculated from those measurements and the assumption of Lambertian emission. The total power efficacy of devices were determined by placing devices in a 20" integrating sphere when an outcoupling enhancement fixture was attached, using index matching fluid, to the WOLED substrate. The effective Lambertian luminance was determined by dividing the total optical flux, measured in a 20" integrating sphere, by 3.14 and by the active device area. CIE refers to the coordinates on the standard color space developed by the Commission Internationale de l'Eclairage (CIE) in 1931. CRI refers to the standard color rendering index (CRI) $R_a$. LT50 is a measure of lifetime, and is the time for light output to decrease by 50% when the device is driven at a constant current.

a refractive index greater than 1.9 at wavelengths shorter than 480 nm, but lower at other wavelengths in the visible range. The high refractive index of IZO may be one reason that Device 1 has a higher power efficacy than Device 2. Device 1 efficacy is also enhanced by using compound A as a blocking layer and by using high concentrations (>15%) of the blue and yellow emitters B and E. The power efficacy of Device 1 was also optimized by using a yellow emitter (compound B), which has an emission spectrum that more efficiently overlaps the photopic response curve. The low voltage of Devices 1 and 2 was enhanced by using a thin (5 nm) blue emissive layer with a correspondingly low voltage drop. Device 1 attains 102 lm/W at an effective luminance of 1,000 nits when it is measured using outcoupling enhancement fixtures in a 20" integrating sphere.

TABLE 1

Device Structure

| | | | | | | | | | | |
|---|---|---|---|---|---|---|---|---|---|---|
| 1 | IZO | J | NPD | A | K:B:C 20%:0.2% | F:E 30% | F | L | LiF/Al |
| | 120 nm | 10 nm | 15 nm | 15 nm | 10 nm | 5 nm | 5 nm | 35 nm | 100 nm |
| 2 | ITO | J | NPD | A | K:B:C 20%:0.2% | F:E 30% | F | L | LiF/Al |
| | 120 nm | 10 nm | 15 nm | 15 nm | 10 nm | 5 nm | 5 nm | 35 nm | 100 nm |
| 3 | ITO | J | NPD | A | K:B:D 20%:0.2% | F:E 30% | F | L | LiF/Al |
| | 120 nm | 10 nm | 15 nm | 15 nm | 15 nm | 5 nm | 5 nm | 37.5 nm | 100 nm |
| 4 | ITO | J | NPD | A | K:B:D 20%:0.8% | F:E 20% | F | L | LiF/Al |
| | 120 nm | 10 nm | 15 nm | 15 nm | 15 nm | 5 nm | 5 nm | 37.5 nm | 100 nm |
| 5 | ITO | J | NPD | A | K:B:D 20%:1.0% | F:E 25% | F | L | LiF/Al |
| | 120 nm | 10 nm | 15 nm | 15 nm | 15 nm | 5 nm | 5 nm | 37.5 nm | 100 nm |
| 6 | ITO | J | NPD | A | F:E:B:C 20%:0.5%:0.5% 15 nm | none | | F | L | LiF/Al |
| | 120 nm | 10 nm | 15 nm | 15 nm | | | | 5 nm | 37.5 nm | 100 nm |
| 7 | IZO | J | NPD | | K:B:D 20%:0.5% 15 nm | G:E 20% 5 nm | G | L | LiF/Al |
| | 120 nm | 20 nm | 30 nm | | | | 5 nm | 35 nm | 100 nm |
| 8 | ITO | J | NPD | M | BAlq:I:C 10%:0.2% 5 nm | mCBP:H:I 12%:0.2% 15 nm | mC BP 2.5 nm | TPBI 40 nm | LiF/Al 100 nm |
| | 120 nm | 10 nm | 30 nm | 5 nm | | | | | |
| 9 | ITO | J | NPD | M | mCBP:H:I 12%:0.2% 15 nm | BAlq:I:C 10%:3% 5 nm | | TPBI 40 nm | LiF/Al 100 nm |
| | 120 nm | 10 nm | 30 nm | 10 nm | | | | | |

TABLE 2

Device Performance for Devices of Table 1

| | at 1000 nits | | | | at 10 mA/cm² | | | from 1000 nits |
|---|---|---|---|---|---|---|---|---|
| | V | cd/A | EQE | PE | CIE x | CIE y | CRI | LT50 |
| 1 | 3.7 | 50.5 | 18.2 | 42.7 | 0.417 | 0.479 | 62.0 | 8,000 |
| 2 | 3.6 | 44.8 | 16.7 | 38.9 | 0.405 | 0.476 | 64.0 | |
| 3 | 3.6 | 44.0 | 16.4 | 38.9 | 0.396 | 0.476 | 66.0 | |
| 4 | 3.7 | 38.9 | 18.0 | 32.7 | 0.469 | 0.434 | 88.0 | |
| 5 | 3.7 | 33.4 | 16.2 | 28.0 | 0.458 | 0.423 | 84.0 | |
| 6 | 4.1 | 34.4 | 15.3 | 26.2 | 0.429 | 0.445 | 84.0 | |
| 7 | 3.0 | 44.6 | 18.0 | 46.1 | 0.495 | 0.458 | 67.0 | 5,000 |
| 8 | 5.8 | 28.4 | 16.0 | 16.0 | 0.5 | 0.38 | 68.0 | |
| 9 | 6.0 | 23.3 | 12.0 | 13.0 | 0.28 | 0.32 | 81.0 | |

Device 1 has a measured device efficiency that is >100 lm/W at an effective Lambertian luminance of 1,000 nits when outcoupling fixtures are attached to the OLED substrate. Additionally, the LT50>8,000 hrs from 1,000 nits. The combination of these two features is highly desirable for illumination products, and is unexpectedly greater than any performance previously reported.

Device 1 and Device 2 are identical except for the anode material. Device 1 uses IZO which has a refractive index >1.9 over the visible range; whereas, Device 2 uses ITO which has Device 3 is near identical to Device 2. Device 3 uses a redder emitter (compound D) than the red emitter (compound C) in Device 2. Compound D was incorporated into Device 3 to increase the device CRI relative to Device 2.

Devices 4 has a higher concentration of compound D than Device 3 and this high concentration of compound D enables a significant boost in the CRI from 66 to 88.

Device 5 has higher concentrations of Compounds D and E than Device 4 to obtain a high CRI at a CIE that is specified for an Energy Star rated solid-state energy light source.

Device 6 shows that the voltage drop across a single EML with all 3 emitters exceeds Device 2 which has the same total EML thicknesses. Device 6 operates at 0.5 V higher voltage than Device 2, and it operates at least 0.4 V above all other examples in the Tables 1 and 2.

Device 7 is a demonstration of the device architecture used to obtain a particularly low voltage device with high efficacy.

Devices 8 and 9 do not have the preferred device architecture described herein, and as a result have higher voltages and lower power efficacy. Devices 8 and 9 have a double emissive layer with the same emissive materials in each of the individual layers, but the order of the layers is flipped. In device 8, the blue emissive material (Compound H), doped in mCBP, is located closer to the reflective cathode than the red emissive material. In device 9, the red emissive material (Compound C), doped in BAlq, is located closer to the reflective cathode than the blue emissive material. Devices 8 and 9 provide an example of materials where the red emissive layer has better electron conductivity than the blue emissive layer, because BAlq is a better electron transporter than mCBP, favoring placement of the red emissive layer closer to the cathode per the device of FIG. 4.

Combination with Other Materials

The materials described herein as useful for a particular layer in an organic light emitting device may be used in combination with a wide variety of other materials present in the device, unless otherwise specified. For example, emissive dopants disclosed herein may be used in conjunction with a wide variety of hosts, transport layers, blocking layers, injection layers, electrodes and other layers that may be present.

The materials described or referred to below are non-limiting examples of materials that may be useful in combination with the compounds disclosed herein, and one of skill in the art can readily consult the literature to identify other materials that may be useful in combination.

In addition to and/or in combination with the materials disclosed herein, many hole injection materials, hole transporting materials, host materials, dopant materials, exciton/hole blocking layer materials, electron transporting and electron injecting materials may be used in an OLED. Non-limiting examples of the materials that may be used in an OLED in combination with materials disclosed herein are listed in Table 3 below. Table 3 lists non-limiting classes of materials, non-limiting examples of compounds for each class, and references that disclose the materials.

TABLE 3

| MATERIAL | EXAMPLES OF MATERIAL | PUBLICATIONS |
|---|---|---|
| Hole injection materials | | |
| Phthalocyanine and porphryin compounds | 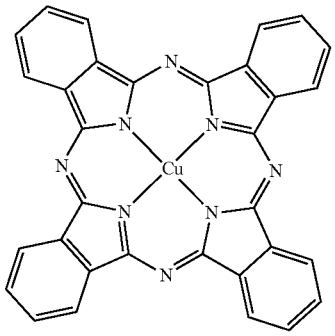 | Appl. Phys. Lett. 69, 2160 (1996) |
| Starburst triarylamines | 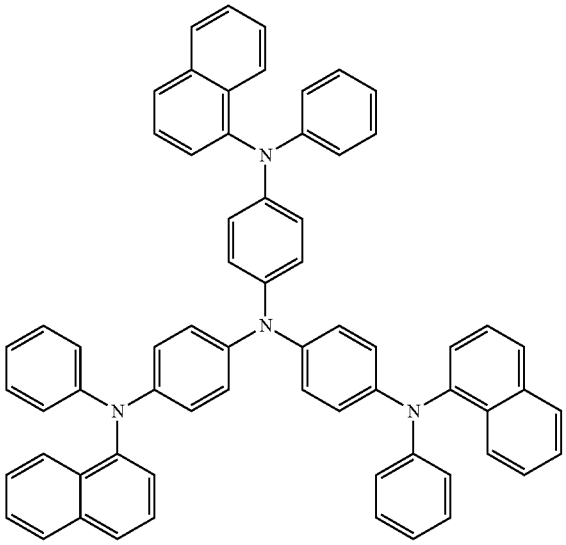 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-\!\!-\!\!(CH_xF_y)_n\!\!-\!\!-$ | Appl. Phys. Lett. 78, 673 (2001) |

TABLE 3-continued

| MATERIAL | EXAMPLES OF MATERIAL | PUBLICATIONS |
|---|---|---|
| Conducting polymers (e.g., PEDOT:PSS, polyaniline, polypthiophene) | | Synth. Met. 87, 171 (1997) |
| Arylamines complexed with metal oxides such as molybdenum and tungsten oxides | + MoO$_x$ | SID Symposium Digest, 37, 923 (2006) |
| Hole transporting materials | | |
| Triarylamines (e.g., TPD, α-NPD) | | Appl. Phys. Lett. 51, 913 (1987) |
| | | US5061569 |
| | | EP650955 |

23  24
TABLE 3-continued
| MATERIAL | EXAMPLES OF MATERIAL | PUBLICATIONS |
|---|---|---|
| | 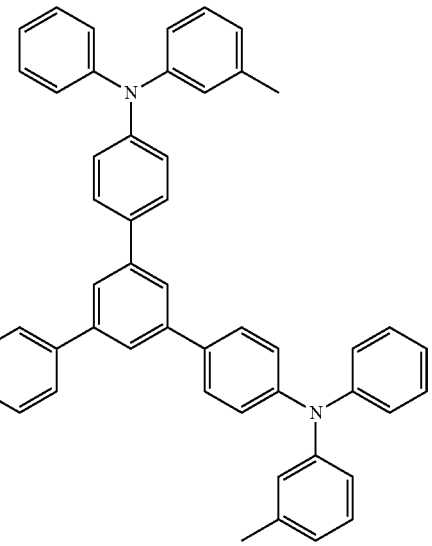 | J. Mater. Chem. 3, 319 (1993) |
| | 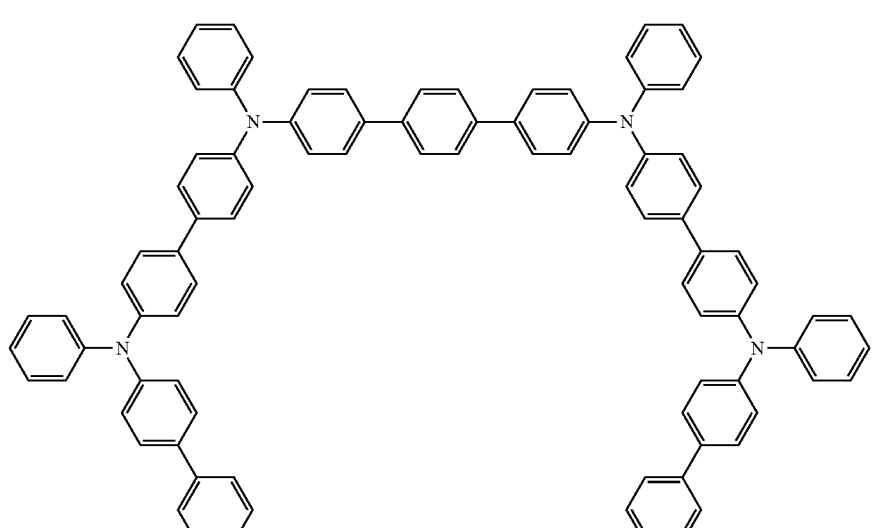 | Appl. Phys. Lett. 90, 183503 (2007) |
| | 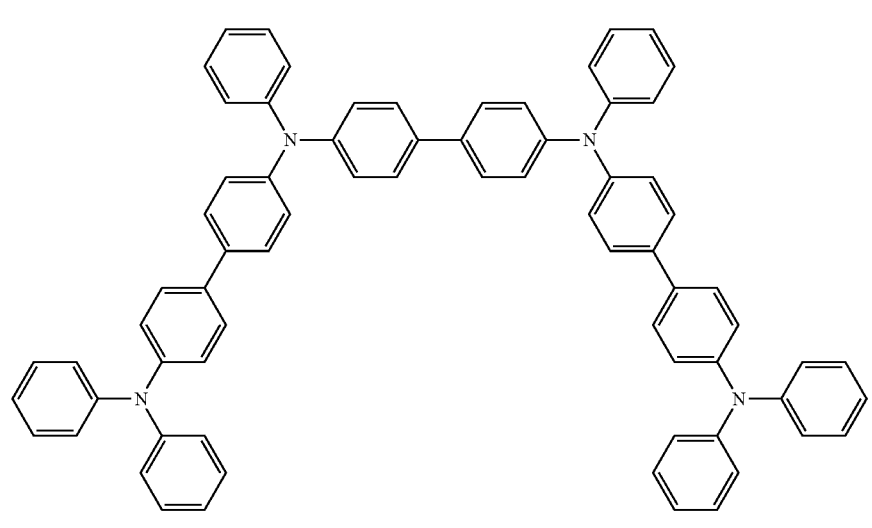 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |

TABLE 3-continued

| MATERIAL | EXAMPLES OF MATERIAL | PUBLICATIONS |
|---|---|---|
| Triarylamine on spirofluorene core | | Synth. Met. 91, 209 (1997) |
| Arylamine carbazole compounds | | Adv. Mater. 6, 677 (1994) |
| Indolocarbazoles | | Synth. Met. 111, 421 (2000) |
| Isoindole compounds | | Chem. Mater. 15, 3148 (2003) |

TABLE 3-continued

| MATERIAL | EXAMPLES OF MATERIAL | PUBLICATIONS |
|---|---|---|
| Phosphorescent OLED host materials | | |
| Red hosts | | |
| Aryl-carbazoles | | Appl. Phys. Lett. 78, 1622 (2001) |
| Metal 8-hydroxy-quinolates (e.g., Alq$_3$, BAlq) | | Nature 395, 151 (1998) |
| | | US 20060202194 |
| | | WO 2005014551 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |

TABLE 3-continued

| MATERIAL | EXAMPLES OF MATERIAL | PUBLICATIONS |
|---|---|---|
| Green hosts | | |
| Aryl-carbazoles | | Appl. Phys. Lett. 78, 1622 (2001) |
| | | US 2003175553 |
| | | WO 2001039234 |
| Aryltriphenylene compounds | | US 20060280965 |
| | | US 20060280965 |
| Polymers (e.g., PVK) | | Appl. Phys. Lett. 77, 2280 (2000) |

TABLE 3-continued
| MATERIAL | EXAMPLES OF MATERIAL | PUBLICATIONS |
|---|---|---|
| Spiro-fluorene compounds | 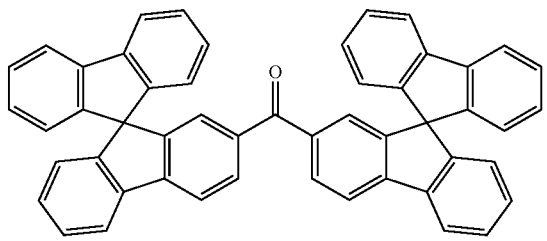 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO 2004093207 |
| Metal phenoxybenzooxazole compounds | 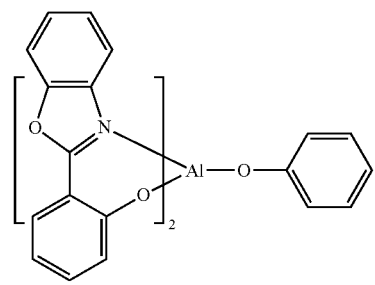 | WO05089025 |
| | 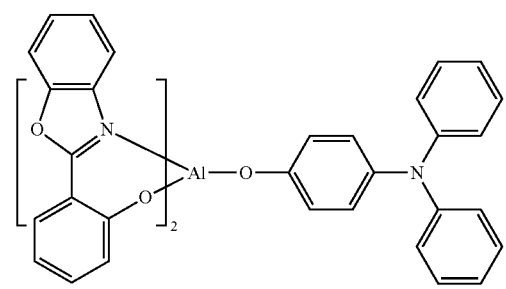 | WO06132173 |
| | 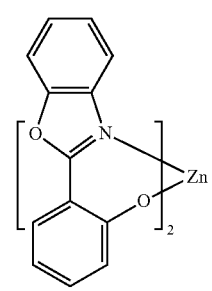 | JP200511610 |
| Spiro-fluorene-carbazole compounds | 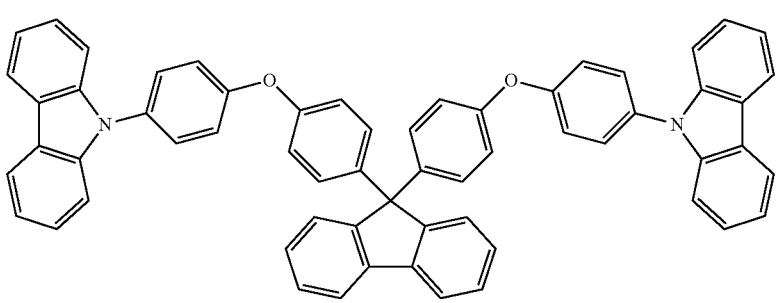 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |

TABLE 3-continued
| MATERIAL | EXAMPLES OF MATERIAL | PUBLICATIONS |
|---|---|---|
| | 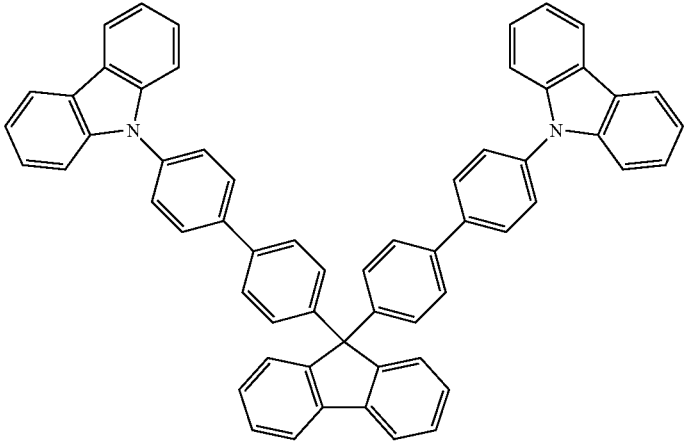 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolo-cabazoles | 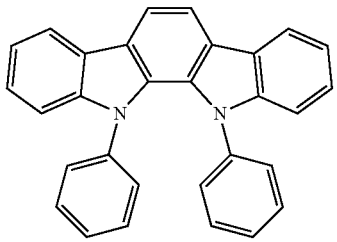 [SMILES: c1ccc(-n2c3ccccc3c3ccc4c5ccccc5n(-c5ccccc5)c4c32)cc1] | WO07063796 |
| | 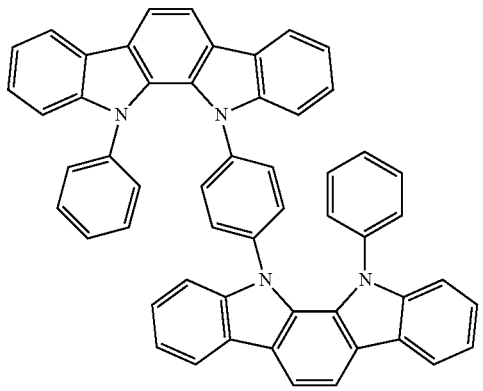 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO07063754 |
| 5-member ring electron deficient heterocycles (e.g., triazole, oxadiazole) | 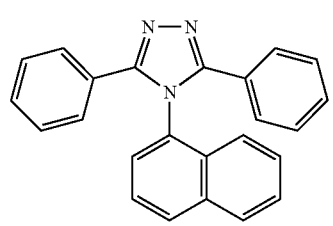 [SMILES: c1ccc(-c2nnc(-c3ccccc3)n2-c2cccc3ccccc23)cc1] | J. Appl. Phys. 90, 5048 (2001) |
| | 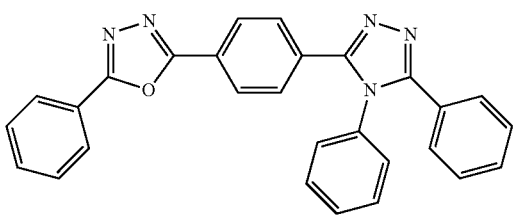 [SMILES: c1ccc(-c2nnc(-c3ccc(-c4nnc(-c5ccccc5)n4-c4ccccc4)cc3)o2)cc1] | WO04107822 |

TABLE 3-continued

| MATERIAL | EXAMPLES OF MATERIAL | PUBLICATIONS |
|---|---|---|
| Metal phenoxypyridine compounds | [structure] | WO05030900 |
| Blue hosts | | |
| Arylcarbazoles | [structure] | Appl. Phys. Lett, 82, 2422 (2003) |
|  | [structure] | US20070190359 |
| Dibenzothiophene-carbazole compounds | [structure] | WO2006114966 |
| Phosphorescent dopants | | |
| Red dopants | | |
| Heavy metal porphyrins (e.g., PtOEP) | [structure] | Nature 395, 151 (1998) |

TABLE 3-continued
| MATERIAL | EXAMPLES OF MATERIAL | PUBLICATIONS |
|---|---|---|
| Iridium(III) organometallic complexes | 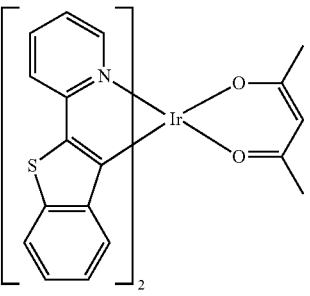 | Appl. Phys. Lett. 78, 1622 (2001) |
| | 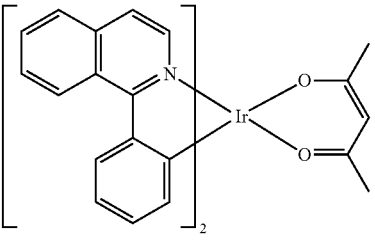 | US06835469 |
| | 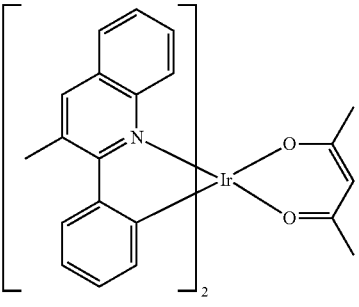 | US06835469 |
| | 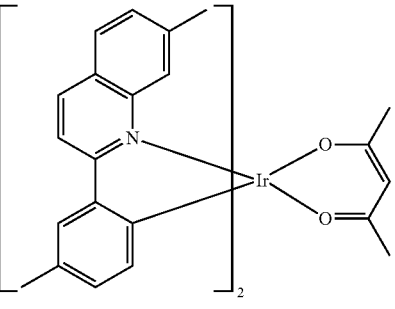 | US 20060202194 |
| | 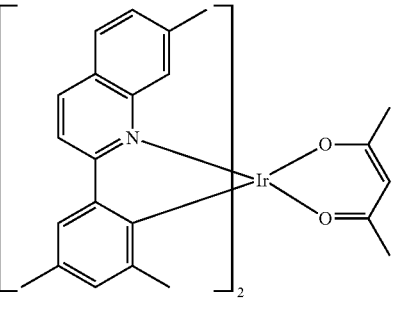 | US 20060202194 |

TABLE 3-continued
| MATERIAL | EXAMPLES OF MATERIAL | PUBLICATIONS |
|---|---|---|
| | 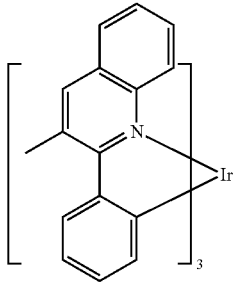 | US07087321 |
| | 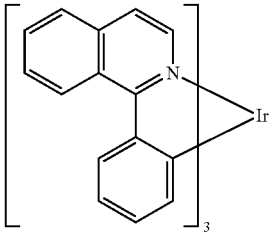 | US07087321 |
| | 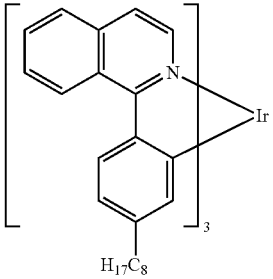 | Adv. Mater. 19, 739 (2007) |
| Platinum(II) organometallic complexes | 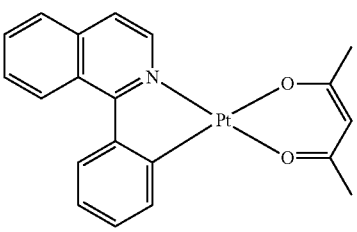 | WO2003040257 |
| Osminum (III) complexes | 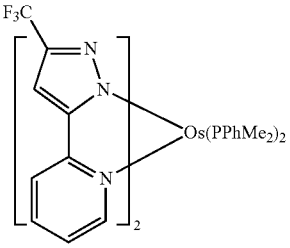 | Chem. Mater. 17, 3532 (2005) |
| Ruthenium (II) complexes | 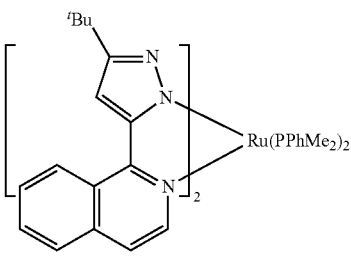 | Adv. Mater. 17, 1059 (2005) |

TABLE 3-continued
| MATERIAL | EXAMPLES OF MATERIAL | PUBLICATIONS |
|---|---|---|
| Green dopants | | |
| Iridium(III) organo-metallic complexes | 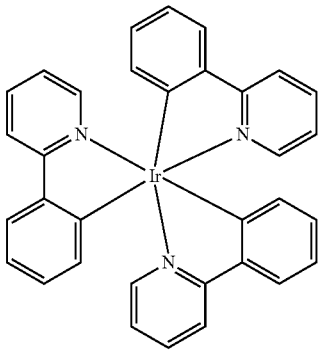 and its derivatives | Inorg. Chem. 40, 1704 (2001) |
| | 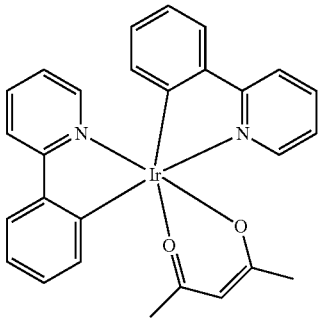 | US2002034656 |
| | 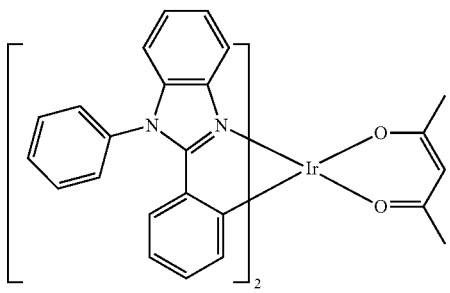 | US06687266 |
| | 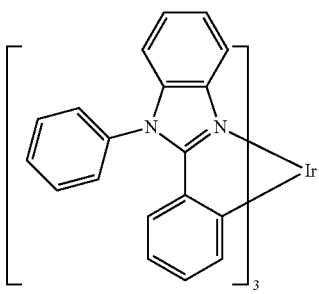 | Chem. Mater. 16, 2480 (2004) |

TABLE 3-continued

| MATERIAL | EXAMPLES OF MATERIAL | PUBLICATIONS |
|---|---|---|
| | | US2007190359 |
| | | US 2006008670<br>JP2007123392 |
| | | Adv. Mater.<br>16, 2003<br>(2004) |
| | | Angew. Chem.<br>Int. Ed.<br>2006,<br>45, 7800 |
| Pt(II) organo-metallic complexes | | Appl. Phys.<br>Lett. 86,<br>153505<br>(2005) |

TABLE 3-continued

| MATERIAL | EXAMPLES OF MATERIAL | PUBLICATIONS |
|---|---|---|
| | | Appl. Phys. Lett. 86, 153505 (2005) |
| | | Chem. Lett. 34, 592 (2005) |
| Gold complexes | | Chem. Commun. 2906 (2005) |
| Rhenium (III) complexes | | Inorg. Chem. 42, 1248 (2003) |
| Blue dopants | | |
| Iridium (III) organometallic complexes | | WO2002002714 |

TABLE 3-continued
| MATERIAL | EXAMPLES OF MATERIAL | PUBLICATIONS |
|---|---|---|
| | 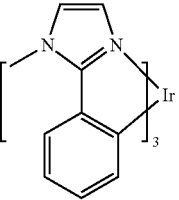 | WO2006009024 |
| | 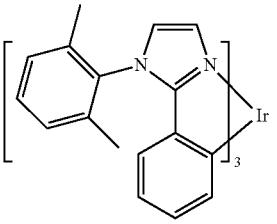 | US2006251923 |
| | 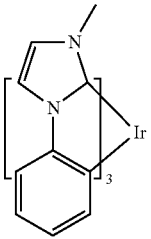 | WO2006056418, US2005260441 |
| | 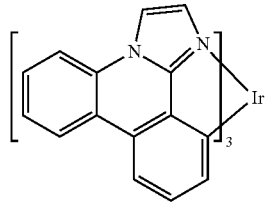 | US2007190359 |
| | 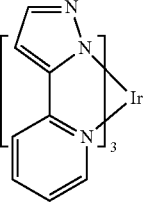 | US2002134984 |
| | 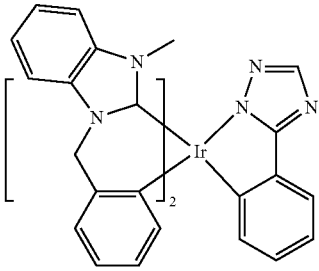 | Angew. Chem. Int. Ed. 47, 1 (2008) |

TABLE 3-continued
| MATERIAL | EXAMPLES OF MATERIAL | PUBLICATIONS |
|---|---|---|
| | 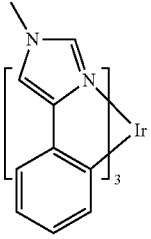 | Chem. Mater. 18, 5119 (2006) |
| | 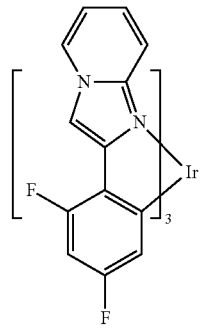 | Inorg. Chem. 46, 4308 (2007) |
| | 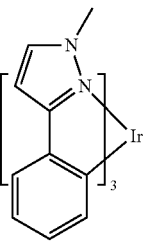 | WO05123873 |
| | 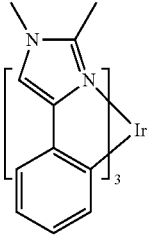 | WO05123873 |
| | 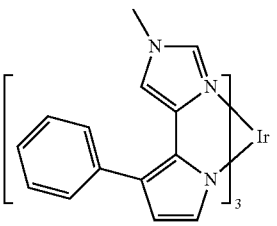 | WO07004380 |

TABLE 3-continued
| MATERIAL | EXAMPLES OF MATERIAL | PUBLICATIONS |
|---|---|---|
| | 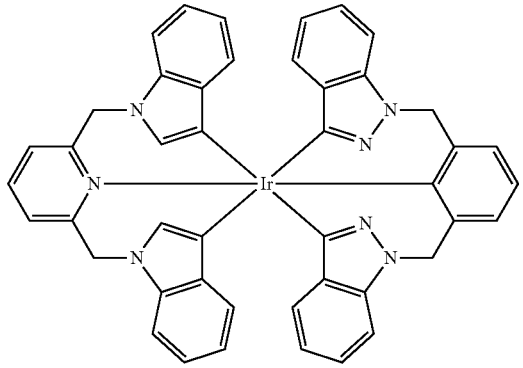 | WO06082742 |
| Osmium (II) complexes | 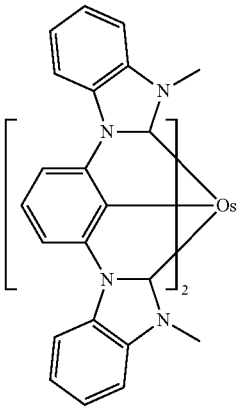 | US2005260449 |
| | 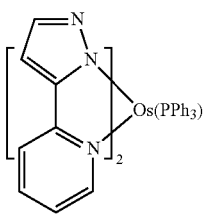 | Organometallics 23, 3745 (2004) |
| Gold complexes | 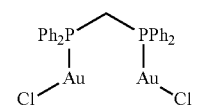 | Appl. Phys. Lett. 74, 1361 (1999) |
| Platinum (II) complexes | 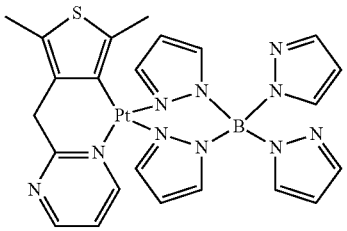 | WO06098120, WO06103874 |

TABLE 3-continued
| MATERIAL | EXAMPLES OF MATERIAL | PUBLICATIONS |
|---|---|---|
| Exciton/hole blocking layer materials | | |
| Bathocuprine compounds | 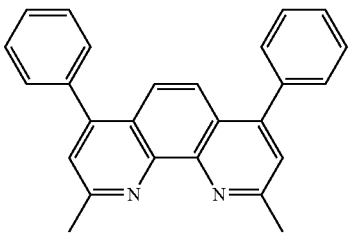 [SMILES: Cc1cc(-c2ccccc2)c2ccc3c(-c4ccccc4)cc(C)nc3c2n1] | Appl. Phys. Lett. 75, 4 (1999) |
| | 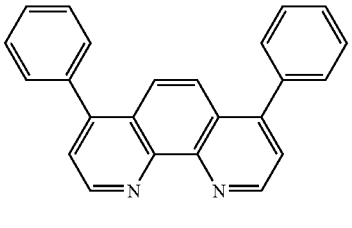 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 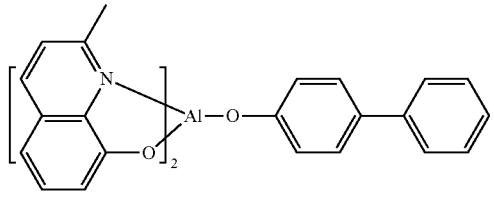 | Appl. Phys. Lett. 81, 162 (2002) |
| 5-member ring electron deficient heterocycles such as triazole, oxadiazole, imidazole, benzoimidazole | 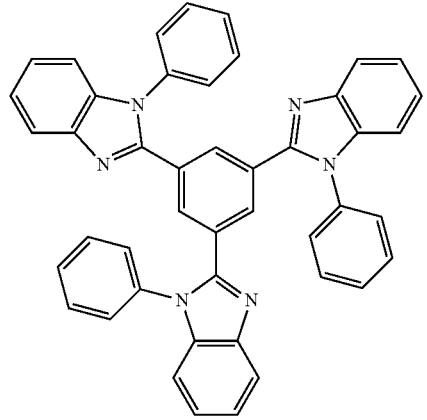 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE 3-continued
| MATERIAL | EXAMPLES OF MATERIAL | PUBLICATIONS |
|---|---|---|
| Triphenylene compounds | 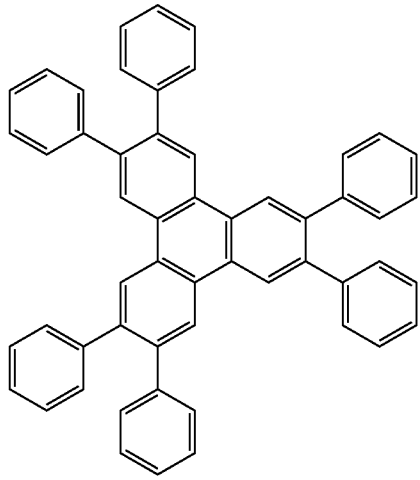 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 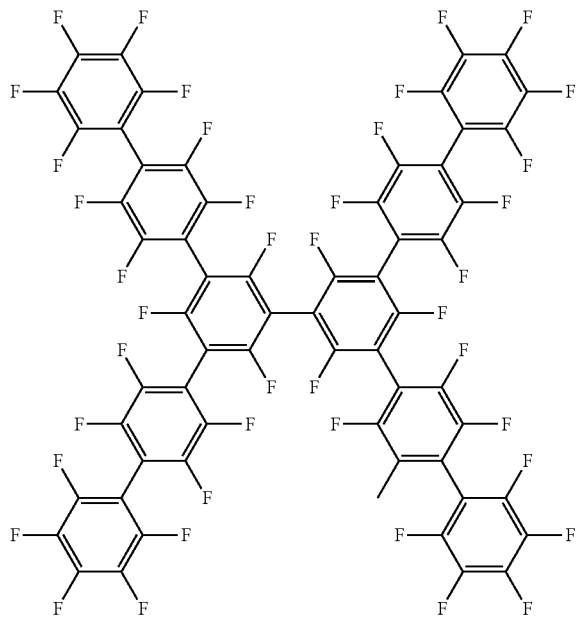 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
Electron transporting materials TABLE 3-continued

| MATERIAL | EXAMPLES OF MATERIAL | PUBLICATIONS |
|---|---|---|
| Anthracene-benzoimidazole compounds | | WO03060956 |
| Anthracene-benzothiazole compounds | | Appl. Phys. Lett. 89, 063504 (2006) |
| Metal 8-hydroxyquinolates (e.g., Alq$_3$) | | Appl. Phys. Lett. 51, 913 (1987) |
| Metal hydroxybenoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |

TABLE 3-continued

| MATERIAL | EXAMPLES OF MATERIAL | PUBLICATIONS |
|---|---|---|
| 5-member ring electron deficient heterocycles (e.g., triazole, oxadiazole, imidazole, benzoimidazole) | | Appl. Phys. Lett. 74, 865 (1999) |
| | | Appl. Phys. Lett. 55, 1489 (1989) |
| | | Jpn. J. Apply. Phys. 32, L917 (1993) |
| Silole compounds | | Org. Electron. 4, 113 (2003) |
| Arylborane compounds | | J. Am. Chem. Soc. 120, 9714 (1998) |

TABLE 3-continued

| MATERIAL | EXAMPLES OF MATERIAL | PUBLICATIONS |
|---|---|---|
| Fluorinated aromatic compounds | [fluorinated aromatic compound structure] | J. Am. Chem. Soc. 122, 1832 (2000) |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

What is claimed is:

1. A device, comprising:
an anode;
a cathode;
a first organic emissive layer, further comprising:
first phosphorescent material having a concentration of 15-35 wt % in the first organic emissive layer, wherein the first phosphorescent material has a peak emissive wavelength in the visible spectrum at a wavelength between 400 nm and 500 nm; and
a first host material having a triplet energy at least 0.2 eV and not more than 1.0 eV greater than the triplet energy of the first phosphorescent material;
wherein the first organic emissive layer is disposed between the anode and the cathode;
a second organic emissive layer further comprising:
a second phosphorescent material having a concentration of 15-35 wt % in the second organic emissive layer, wherein the second phosphorescent material has a peak emissive wavelength in the visible spectrum at a wavelength between 500 nm and 600 nm;
a third phosphorescent material having a concentration of 0.1-3 wt % in the second organic emissive layer, wherein the third phosphorescent material has a peak emissive wavelength in the visible spectrum at a wavelength between 600 nm and 700 nm;
a second host material having a triplet energy greater than that of the third phosphorescent emissive material;
wherein the second organic emissive layer is disposed between the anode and the cathode, and is adjacent to the first organic emissive layer;
a blocking layer disposed adjacent to the second organic emissive layer and between the second organic emissive layer and the anode, the blocking layer having a lowest unoccupied molecular orbital that is at least 0.1 eV greater than the lowest unoccupied molecular orbital of the second host material;
a hole transport layer disposed between the blocking layer and the anode;
wherein at least one of the anode and the cathode is transmissive.

2. The device of claim 1, wherein the anode is transmissive and the cathode is reflective.

3. The device of claim 2, wherein the second organic emissive layer is disposed closer to the anode than the first organic emissive layer.

4. The device of claim 1, wherein the anode is reflective and the cathode is transmissive.

5. The device of claim 4, wherein the second organic emissive layer is disposed closer to the cathode than the first organic emissive layer.

6. The device of claim 1, wherein the first host material has a triplet energy at least 0.2 eV and not more than 0.5 eV greater than the triplet energy of the first phosphorescent material.

7. The device of claim 1, wherein the hole transport layer consists essentially of NPD.

8. The device of claim 1 wherein the hole transport layer has a hole mobility of at least $5 \times 10^{-4}$ cm$^2$ V$^{-1}$ s$^{-1}$.

9. The device of claim 1, wherein the anode consists essentially of indium zinc oxide.

10. The device of claim 1, wherein the voltage drop across the device at a luminance of 1000 cd/m$^2$ is 3.5 eV-4.1 eV.

11. The device of claim 1, wherein the voltage drop across the device at a luminance of 1000 cd/m$^2$ is less than 3.7 eV.

12. The device of claim 1, wherein the second phosphorescent material is compound B.

13. The device of claim 1, wherein the first organic emissive layer has a thickness of 4 nm to 10 nm.

14. The device of claim 1, wherein the blocking layer has a thickness of 12-37 nm and the hole transport layer has a thickness of 12-37 nm.

15. A consumer product, comprising a device, the device further comprising:
an anode;
a cathode;
a first organic emissive layer, further comprising:
first phosphorescent material having a concentration of 15-35 wt % in the first organic emissive layer, wherein the first phosphorescent material has a peak emissive wavelength in the visible spectrum at a wavelength between 400 nm and 500 nm; and
a first host material having a triplet energy at least 0.2 eV and not more than 1.0 eV greater than the triplet energy of the first phosphorescent material;
wherein the first organic emissive layer is disposed between the anode and the cathode;
a second organic emissive layer further comprising:
a second phosphorescent material having a concentration of 15-35 wt % in the second organic emissive layer, wherein the second phosphorescent material has a peak emissive wavelength in the visible spectrum at a wavelength between 500 nm and 600 nm;

a third phosphorescent material having a concentration of 0.1-3 wt % in the second organic emissive layer, wherein the third phosphorescent material has a peak emissive wavelength in the visible spectrum at a wavelength between 600 nm and 700 nm;

a second host material having a triplet energy greater than that of the third phosphorescent emissive material;

wherein the second organic emissive layer is disposed between the anode and the cathode, and is adjacent to the first organic emissive layer;

a blocking layer disposed adjacent to the second organic emissive layer and between the second organic emissive layer and the anode, the blocking layer having a lowest unoccupied molecular orbital that is at least 0.1 eV greater than the lowest unoccupied molecular orbital of the second host material;

a hole transport layer disposed between the blocking layer and the anode;

wherein at least one of the anode and the cathode is transmissive.

* * * * *